United States Patent [19]

Ishizaka et al.

[11] Patent Number: 4,949,057
[45] Date of Patent: Aug. 14, 1990

[54] DISTRIBUTED CONSTANT TYPE DELAY LINE DEVICE AND A MANUFACTURING METHOD THEREOF

[75] Inventors: Taeko Ishizaka, Tokyo; Yoshihiko Kasai; Hajime Okamura, both of Yokohama, all of Japan

[73] Assignee: Fujitsu Limited, Kawasaki, Japan

[21] Appl. No.: 384,729

[22] Filed: Jul. 25, 1989

[30] Foreign Application Priority Data

Jul. 28, 1988 [JP] Japan .................. 63-186928

[51] Int. Cl.⁵ .................................... H01P 9/00
[52] U.S. Cl. ............................. 333/161; 333/156; 336/200
[58] Field of Search ............... 333/156, 161, 139, 140, 333/246, 164; 336/200, 232

[56] References Cited

U.S. PATENT DOCUMENTS 3,670,270 6/1972 Storey .................. 333/161
4,641,113 2/1987 Ozawa .................. 333/161

*Primary Examiner*—Eugene R. LaRoche
*Assistant Examiner*—Seung Ham
*Attorney, Agent, or Firm*—Staas & Halsey

[57] ABSTRACT

A distributed constant type delay line device comprises a first base body with a first cutout portion at a bottom corner thereof, a first delay path pattern provided on a first side of the first base body, a first ground conductor provided on a second side of the first base body, a second base body with a second cutout portion at a bottom corner thereof in correspondence to cutout portion of the first base body, a second delay path pattern provided on a first side of the second base body, a second ground conductor provided on a second side of the second base body, in which the second base body is combined with the first base body by contacting the second ground conductor to the first ground conductor such that the first cutout portion on the first base body exposes a part of the second ground conductor at another bottom corner of the second base body and that the second cutout portion exposes a part of the first ground conductor at another bottom corner of the first base body, a pair of input/output pins respectively provided on the first and second base bodies for connection with respective first ends of the first and second delay path patterns, a single jumper provided so as to bridge the first and second base bodies for connecting a second end of the first delay path pattern to a second end of the second delay path pattern, and a pair of ground pins respectively provided on the first and second base bodies for connection with exposed parts of the first and second ground conductors.

5 Claims, 5 Drawing Sheets

FIG. 1 (PRIOR ART)
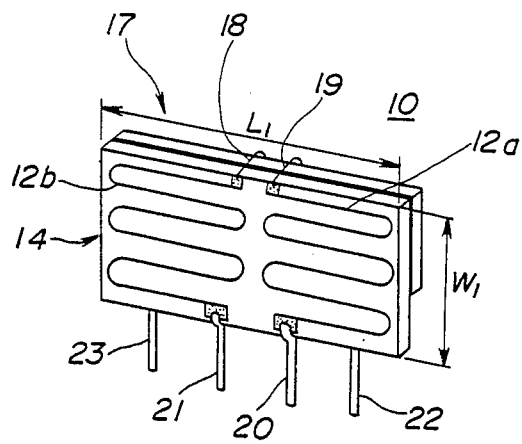
FIG. 2 (PRIOR ART)
FIG. 3 (PRIOR ART)
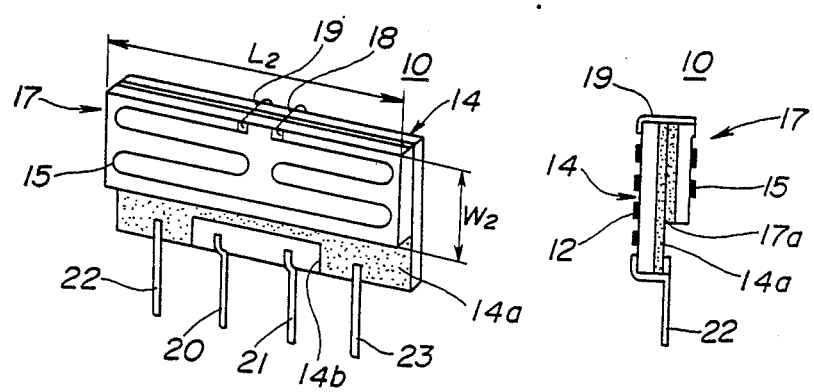

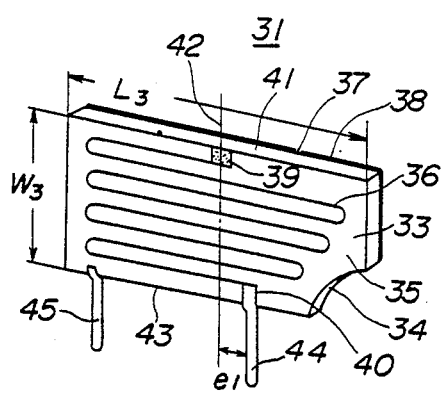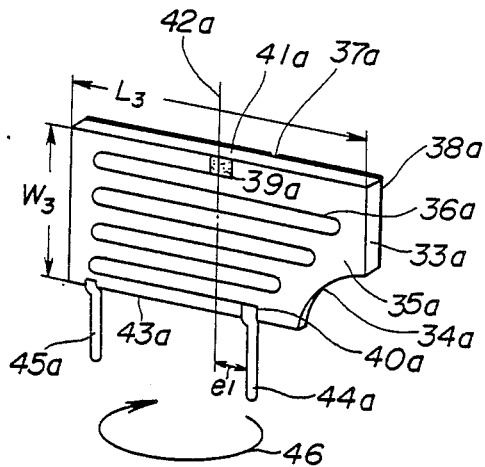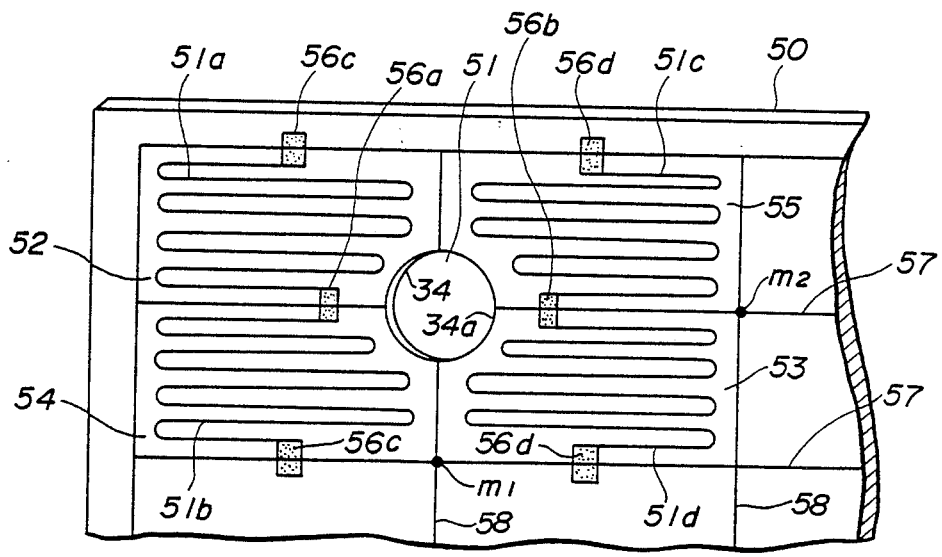

DISTRIBUTED CONSTANT TYPE DELAY LINE DEVICE AND A MANUFACTURING METHOD THEREOF

BACKGROUND OF THE INVENTION

The present invention generally relates to delay line devices and more particularly to a distributed constant type delay line device and a manufacturing method thereof.

In digital processing systems such as telecommunication systems and computers in which processing of digital signals is performed, a distributed constant type delay line device is used for timing adjustment of the signals or adjustment of delay time of the signal so that the digital signals passed through various components and wiring patterns have a proper timing.

The distributed constant type delay line device is a device comprising a plate-like base body carrying a delay path pattern on one side for delaying the signal passing therethrough. When the delay time to be obtained by such a device exceeds about 2 nanoseconds, however, ordinary sized delay line device is not appropriate for the purpose, as the device cannot produce such a large delay time. Thus, the delay line device is constructed by assembling two base bodies respectively carrying delay line patterns so that a long delay path is formed.

FIGS. 1 and 2 show a prior art delay line device 10 using two base bodies. Referring to the drawings, the device 10 comprises a first base body 14 printed with a conductor pattern 12 which in turn comprises a pair of zigzag conductor patterns 12a and 12b as shown in FIG. 1 and a second base body 17 printed with another zigzag conductor pattern 15. The conductor pattern 12a and the conductor pattern 12b are provided on a front side of the first base body 14 and are formed symmetrically about a center line (not shown) passing centrally through the body 14. On the other hand, the conductor pattern 15 is a single pattern formed also symmetrically on a front side of the second base body 17. Further, the base bodies 14 and 17 carry conductor layers 14a and 17a on respective rear sides for ground connection and are assembled as a unitary body by connecting the conductive layers as shown in FIG. 3 by soldering or glueing using a conductive adhesive.

As can be seen from FIGS. 1 and 2, the base body 14 has a length $L_1$ and a width $W_1$ and the base body 17 has a length $L_2$ and a width $W_2$, in which the width $W_1$ is made substantially larger than the width $W_2$. On the other hand, the length $L_1$ and the length $L_2$ are made identical. In the delay line device 10 having such a construction, a pair of connection pins 20 and 21 are provided on a bottom edge of the base body 14 and are connected to respective first ends of the conductor patterns 12a and 12b. Further, respective second ends of the conductor patterns 12a and 12b are connected to ends of the conductor pattern 15 by jumpers 18 and 19 as shown in FIGS. 1 and 2. Furthermore, ground pins 22 and 23 are provided on the bottom edge of the base body 14 in contact with the conductor layer 14a as shown in FIG. 2. In order to avoid contact between the conductor layer 14a and the pins 20 and 21, there is provided a cutout region 14b in the conductor layer 14a along the bottom edge of the body 14 for avoiding the pins 20 and 21.

Thus, an input signal applied to the pin 20 is passed through the conductor 12a, conductor 15 and the conductor 12b and reaches the pin 21 with a delay time proportional to the distance of the delay path extending from the pin 20 to the pin 21.

In such a prior art delay line device, there is a problem in that the obtained delay time is limited due to the limited size of the second base body 17 having the width $W_2$ which is substantially reduced with respect to the width $W_1$ of the first base body 14. Such a difference in size of the base body is needed for securing region for connection of the pins 20 –23 at the bottom edge of the base body 14. When the second base body 17 is designed to have a same size as that of the base body 14, there would be no place for providing the pins 20 and 21 for input and output of the signals and particularly for the pins 22 and 23 for ground connection as the conductor layer 14a or 17a is fully embedded in the base bodies. Thus, the conventional delay line device inevitably has to be designed to use two different base bodies having different sizes which, however, inevitably invites increase in size of the device when a large delay time is needed. However, such an increase in the size of the device is undesirable from the view point of reducing the size of the apparatus using the delay line device.

Further, such a prior art delay line device has a problem in manufacturing because of the difference in the size of the base body 14 and the base body 17. Thus, when the base body 14 and the base body 17 are obtained by cutting of a large board, one has to provide two separate boards, one for the base body 14 and the other for the base body 17, as the cutting of a single board into the body 14 and body 17 having different sizes and shapes needs an extremely complex sawing operation. Associated with the use of different base bodies 14 and 17, there is another problem in that the conductor patterns 12 for the base body 14 and the conductor pattern 15 for the base body 17 have to be provided separately. Such a separately performed patterning increases the number of manufacturing steps and hence the cost of the device.

Further, the prior art delay line device has another problem in that two jumpers 18 and 19 have to be used for connecting the conductor pattern 12 to the conductor pattern 15. Such a use of two jumpers increases the risk that the connection is failed and thus reduces the reliability of the device. Needless to say, the manufacturing step is increased by using two jumpers as compared to the case where no or single jumper is used.

In the prior art delay line device, there is still another problem in that the conductor layer 14a provided on the rear side of the base body 14 has to be patterned such that the conductor layer 14a avoids the vicinity of the pins 20 and 21. Such patterning of the conductor layer 14a obviously decreases the efficiency of production of the device.

Furthermore, the prior art device carries both the pin 20 for inputting the signal and the pin 21 for outputting the signal on the base body 14. In other words, there is a forward path comprising the conductor pattern 12a and a left half of the conductor pattern 15 for passing the input signal applied to the input terminal 20 towards the interior of the device and a return path comprising a right half of the conductor pattern 15 and the conductor patter 12a for passing the signal to the output terminal 21. Thus, it is inevitable that the conductor patterns 12 and 15 are turned a number of times for a predetermined length of the delay path. When such a turn or bend is made in the conductor pattern, there is an increase in the inductance which may cause undesirable impedance change in combination with capacitance underneath the conductor pattern.

SUMMARY OF THE INVENTION

Accordingly, it is a general object of the present invention to provide a novel and useful distributed constant type delay line device wherein the aforementioned problems are eliminated.

Another and more specific object of the present invention is to provide a distributed constant type delay line device in which the size of the device is reduced for a predetermined delay time to be obtained by the device.

Another object of the present invention is to provide a distributed constant type delay line device in which a manufacturing process thereof is substantially simplified.

Another object of the present invention is to provide a distributed constant type delay line device in which reliability of the device is substantially improved.

Another object of the present invention is to provide a distributed constant type delay line device comprising a first base body carrying a first delay path pattern on a front side and a ground conductor layer on a rear side, and a second base body having a substantially identical size and shape as those of the first base body and carrying a second delay path pattern on a front side as well as a ground conductor layer on a rear side, wherein said first and second base bodies are assembled as a unitary body by contacting the respective ground conductor layers each other, each of the base bodies has a same corner portion thereof cut out for exposing the conductor layer on the other base body when assembled, and there is a ground pin connected to the exposed ground conductor at each of such corners. According to the present invention, the corner of the base body which is not provided with the delay path pattern is used efficiently for connection to the ground pin and the length of the delay path can be increased without increasing the size of the device by utilizing substantially entire front side of the base bodies for the delay path pattern. Further, the manufacturing process of the device is simplified as the both base bodies have substantially identical size and shape and thus can be cut out from a large board by a simple process. The manufacturing process is further simplified as the rear side of the base body is covered by the ground conductor layer uniformly. In contrast, the prior art device has to be provided with a cutout region in the ground conductor layer so as to avoid connection pins. Further, the device of the present invention needs only one jumper for connecting the first and second delay path patterns, as there is only one pattern on each of the first and second base bodies which are connected at one point. Accordingly, failure of the device caused by the failure of the jumper is substantially reduced. As the base bodies to be assembled have substantially identical size and shape, the assembly work of the device is greatly simplified. Further, the number of turns in the delay path pattern is substantially reduced and associated therewith, impedance change in the device is substantially reduced.

Other objects and further features of the present invention will become apparent from the , following detailed description when read in conjunction with attached drawings.

BRIEF DESCRIPTION OF THE DRAWINGS

FIG. 1 is a perspective view showing a prior art distributed constant type delay line device;

FIG. 2 is a perspective view showing a rear side of the device of FIG. 1;

FIG. 3 is a side view showing the device of FIG. 1;

FIG. 7 is a perspective view showing a first base body forming a part of the device of FIG. 4;

FIG. 8 is a perspective view showing a second base body forming a part of the device of FIG. 4;

FIG. 9 is a plan view showing a large board on which a number of base bodies are defined with respective delay path patterns printed thereon, in a state prior to cutting into respective pieces;

DETAILED DESCRIPTION

Figure 4:
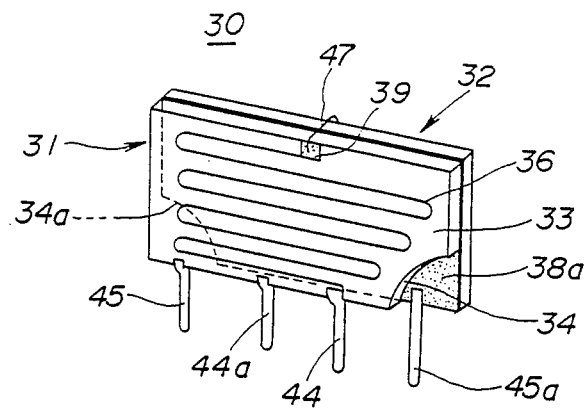
FIG. 4 is a distributed constant type delay line device according to a first embodiment of the present invention.
Figures 5, 6:
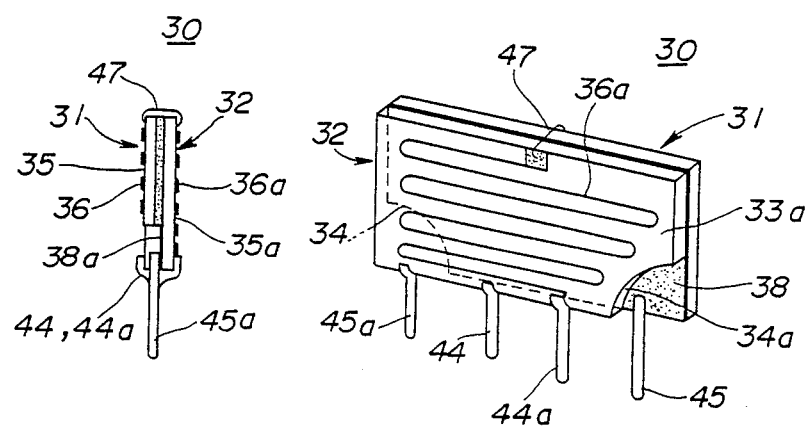
FIG. 5 is a side view showing the device of FIG. 4.
FIG. 6 is a perspective view showing a rear side of the device of FIG. 4.

FIGS. 4 through 6 show a distributed constant type delay line device 30 according to an embodiment of the present invention. The device comprises a first base body 31 shown in detail in FIG. 7 and a second base body 32 shown in detail in FIG. 8. As illustrated in FIG. 7, the base body 31 comprises a rectangular ceramic chip 33 having a length $L_3$ and a width $W_3$ in which a lower right corner thereof is removed according to a quadrant of a circle as shown by a cutout part 34. The ceramic chip 33 carries a zigzag delay path pattern 36 on its front side 35 and a uniform conductor layer 38 on its rear side 37 such that the rear side 37 is covered by the conductor layer 38 uniformly. Further, the ceramic chip 33 carries a pair of connection pad regions 39 and 40 in correspondence to both ends of the delay path pattern 36. It should be noted that the connection pad 39 is provided in coincidence with a center line 42 passing through a long upper edge 41 as well as through a bottom edge 43 of the chip 33 while the connection pad 40 is provided so as to be offset by a distance $e_1$ from the center line 42 as clearly illustrated in FIG. 7.

The chip 33 carries an input/output pin 44 on the lower edge 43 such that the pin 44 is connected to the connection pad 39. Thus, the pin 44 projects downwards from the lower edge 43. Further, the ceramic chip 33 carries a ground pin 45 on the lower edge 43 at a corner opposite from the corner where the cutout part 34 is provided with respect to the center line 42.

The second base body 32 has an exactly the same construction as shown in FIG. 8 and the description thereof will be omitted. In order to distinguish the parts in the base body 32 from those corresponding parts in the base body 31, a suffix "a" will be attached to the reference numeral. It should be noted that the ceramic chip 33a has size and shape which are identical to those of the ceramic chip 33.

When assembling the device 30, the second base body 32 is turned around by 180 degrees about its center line 42a as illustrated by an arrow 46 in FIG. 5 and is combined together with the first base body 31 such that the rear side 37 and the rear side 37a make a uniform contact via the ground pattern layers 38 and 38a.

FIGS. 4 and 6 show the front side and the rear side of the delay line device 30, respectively. As illustrated in the drawing, the ground pin 45a is connected to the ground conductor layer 38a at the lower right corner of the device 30. It should be noted that the part of the conductor layer 38a is exposed by the cutout part 34 of the base body 31 (FIG. 4). Similarly, the ground pin 45 on the base body 31 is connected to the ground conductor layer 38 at the lower right corner of the device 30 exposed by the cutout part 34a (FIG. 6). Further, the pins 44 and 44a are disposed symmetrically with respect to the center line 42 as illustrated in FIGS. 4 and 6. Further, the delay path patterns 36 and 36a are connected to each other at the top edge 41 by a jumper 47 which connects the connection pads 39 and 39a. Note that the pad 39 and the pad 39a are provided exactly on the center line 42 and therefore corresponds each other when the delay line device is assembled. Thus, the delay path pattern 36 and the delay path pattern 36a are connected in series by the jumper 47 and the signal applied to the pin 44 is passed through a delay path having an overall length equal to a sum of the length of pattern 36 and the pattern 36a, whereby the signal is arrived at the pin 44a with a delay time proportional to the overall length.

As shown in FIGS. 7 and 8, the lower right corner of the base bodies 31 and 32 is cut out so as to provide the ground pins 45a and 45, respectively. As the purpose of such cutout part 34 or 34a is only to expose a part of the ground conductor layer 38 or 38a for connection with the pins 45 and 45a, the area removed from the base bodies by the cutout parts is minimum and there is no substantial decrease in the length of the delay path pattern. Thus, the delay line device of the present invention can accommodate the delay path pattern having a predetermined length while at the same time reducing the size of the device. Alternatively, when the device is made to have a conventional size, one can obtain a longer delay time as compared to the prior art device.

Further, as the device of the present invention uses only one jumper 47, the chance that the device fails to operate because of the defective connection at the jumper 47 is substantially reduced.

Next, manufacturing feature of the delay line device of the present invention will be described with reference to FIG. 9. In FIG. 9, these parts constructed identically to those corresponding parts in the preceding drawings are given identical reference numerals and the description thereof will be omitted.

Figure 10:
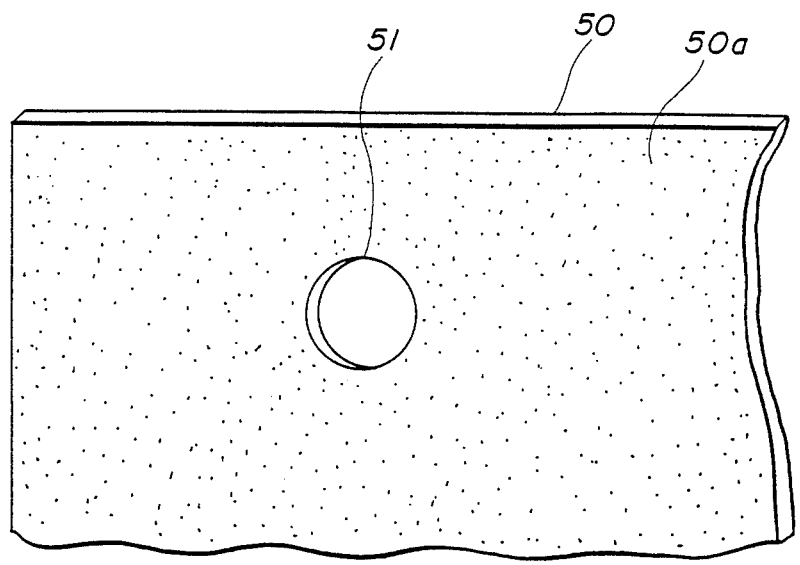
FIG. 10 is a plan view showing the board of FIG. 9 in a state that the board is covered with a conductor layer uniformly.

When manufacturing the delay line device shown in FIGS. 4 and 6, a large ceramic board 50 with a regularly spaced round holes 51 is used. It should be noted that the round hole 51 is arranged in a row and column formation. Next, both sides of the ceramic board 50 is coated with a conductor 50a as shown in FIG. 10 and the conductor on the one side is patterned such that there are four conductor patterns 51a–51d, two (51a and 51b) on one side of the hole 51 and two (51c and 51d) on the other side of the hole 51. The patterns 51a and 51b are connected each other and the patterns 51c and 51d are connected each other. Further, the conductor patterns 51a–51d are disposed symmetrically about a center of the round hole 51. In other words, there is a center of symmetry at the center of the hole 51. Note that the pattern 51a is connected to the pattern 51b below at a conductor part 56a acting as a connection pad and the pattern 51c is connected to the pattern 51d similarly at a conductor part 56b. Further, such patterns 51a–51d are repeated for each of the round holes 51, wherein each of the the conductor patterns 51a and 51b is connected to an adjacent conductor pattern (not shown) at a conductor part 56c and each of the conductor patterns 51c and 51d is connected to an adjacent conductor at a conductor part 56d. Thus, the patterns 51a and 51b, or the patterns 51c and 51d are symmetrical about lines 57 and 58 passing through the center of the hole 51 horizontally and vertically.

Next, the ceramic board 50 is cut along the longitudinal lines 57 as well as along the transversal lines 58 each passing either through the center of respective holes 51 or midpoints $m_1$ or $m_2$ between adjacent holes, and the ceramic pieces 33 and 34 carrying the delay path patterns 36 and 36a are obtained. Responsive to the cutting of the board 50 into the ceramic pieces, the connection pads 39 and 39a are formed in correspondence to the conductor parts 56c and 56d, the connection pads 40 and 40a are formed in correspondence to the conductor parts 56a and 56b, and the ground conductor layers 38 and 38a are formed in correspondence to the conductor 50a. Such ceramic pieces 33 and 33a are then combined each other by contacting the ground conductor layers 38 and 38a and are assembled as a unitary body by soldering the both conductor layers or glueing the conductor layers using electrically conductive adhesives. It should be noted that the assembling is made such that both base bodies register each other and the lower right corner of the conductor layer 38 or 38a is exposed for connection to the ground pins 45 or 45a.

After connection of the pads 39 and 39a by the jumper 47, the ground pins 45 and 45a are provided respectively on the ceramic chips 33 and 33a as already described, and the pins 44 and 44a are provided so as to contact with the connection pads 40 and 40a. As can be seen from the side view of FIG. 5, the jumper 47 and the pins 44, 44a, 45 and 45a hold the assembled ceramic chips firmly from both sides.

According to the present invention, both of the first and second ceramic chips 33 and 33a can be cut out from a single ceramic board with respective delay path patterns printed thereon by a simple sawing operation. Further, as a consequence of use of the single ceramic board, patterning of the delay path can be simplified, as the hitherto needed separately performed patternings for forming different delay path patterns on different ceramic chips, is eliminated in the present invention. The manufacturing of the device of the present invention is also simplified as a result of use of the single jumper for connecting the patterns 36 and 36a. Further, manufacturing of the device is simplified as the hitherto needed cutout of the ground conductor layer for avoiding the connection pins as shown in the prior art device of FIG. 2 can be eliminated and the efficiency of production of the device is significantly improved.

Figure 11:
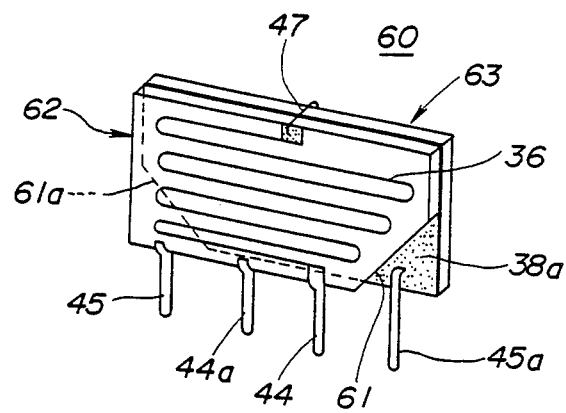
FIG. 11 is a perspective view showing a second embodiment of the device of the present invention.

FIG. 11 shows a second embodiment of the distributed time constant type delay line device of the present invention. In the drawing, these parts constructed identically to those corresponding parts in the preceding drawings are given identical reference numerals and the description thereof will be omitted.

The device of FIG. 11 is essentially the same as the device of FIG. 4 except that a first base body 62 has its lower left corner cut out linearly as shown by a cutout part 61. Similarly, a second base body 63 has its lower left corner (when viewed from a rear side in FIG. 11) cut out linearly as shown by a cutout part 61a. As a result, there is formed a triangular exposed region in the ground conductor layer 38a in correspondence to the cutout part 61 and another triangular exposed region in the ground conductor layer 38 (not shown) in correspondence to the cutout part 61a. The ground pins 45 and 45a are contacted to the ground conductor layers 38a and 38 at such exposed parts. As other constructions are identical to those of the device of the first embodiment, further description of the device of FIG. 11 will be omitted.

Figure 12:
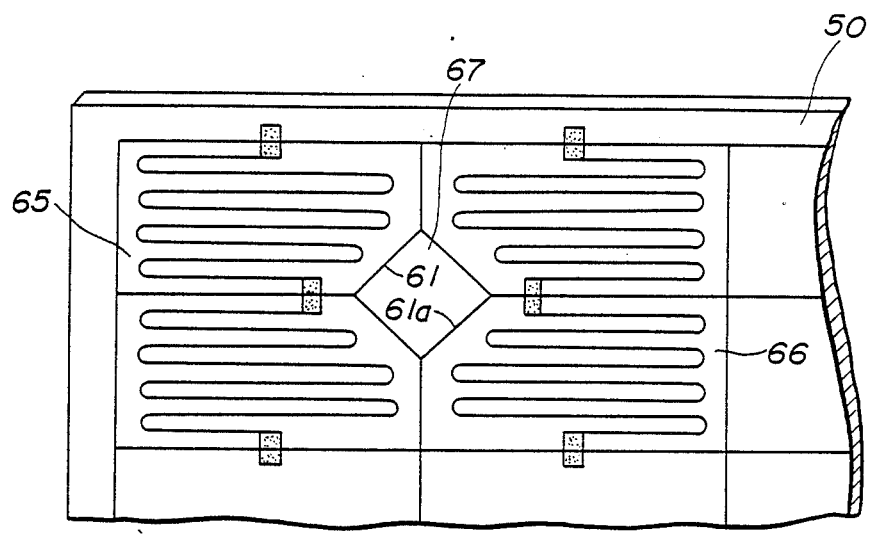
FIG. 12 is a plan view similar to FIG. 9 showing a large board on which a number of base bodies forming the device of FIG. 11 are defined with respective delay path patterns printed thereon, in a state prior to cutting into respective pieces.

FIG. 12 shows the ceramic board used for production of the device of FIG. 11. In the drawing, these parts having identical construction with those corresponding parts in the preceding drawings are given identical reference numerals and the description thereof will be omitted. In this embodiment, it can be seen that a square hole 61 is provided on the ceramic board 50 in place of the round hole 51. As other processes for manufacturing the device of FIG. 11 are substantially identical to those of the first embodiment, further description will be omitted.

Further, the delay path patterns 36 and 36a need not to be identical to each other but may be different. For example, the pattern 12 and 15 as shown in FIGS. 1 and 2 may also be used depending on the needs. Of course, the cutout part at the lower left corner of the device can be provided at the lower right corner of the device. Further, the size and shape of the cutout parts in the first base body and the second base body may be changed depending on the needs. Thus, the through hole provided on the ceramic board 50 before cutting the board into respective ceramic pieces is not limited to the true circle or square as shown in FIG. 9 or FIG. 12 but may take a different form. In one example, the form of the cutout part may be changed in the first and second base bodies such that the first base body has a round cutout part as shown in FIG. 4 and the second base body has a straight cutout part as shown in FIG. 11.

Further, the present invention is not limited to these embodiments but various variations and modifications may be made without departing from the scope of the invention.

What is claimed is:

1. A distributed constant type delay line device, comprising:

a first base body having a first cutout portion at a first bottom corner thereof;

a first delay path pattern provided on a front side of the first base body;

a first ground conductor provided on a rear side of the first base body;

a second base body having a second cutout portion at a first bottom corner thereof corresponding to said first bottom corner of the first base body when viewed from a front direction of the second base body;

a second delay path pattern provided on a front side of the second base body;

a second ground conductor provided on a rear side of the second base body;

said second base body being combined with said first base body by contacting the second ground conductor to the first ground conductor such that said first cutout portion on the first base body exposes a part of the second ground conductor covering a second bottom corner of the second base body which is not provided with the second cutout portion and that said second cutout portion exposes a part of the first ground conductor covering a second bottom corner of the first base body which is not provided with the first cutout portion when the first and second base bodies are assembled;

a pair of input/output pins provided on said first and second base bodies for connection with respective first ends of the first and second delay path patterns;

a pair of ground pins provided on the respective second bottom corners of said first and second base bodies for connection with exposed parts of the first and second ground conductors; and a jumper member provided so as to bridge the first and second base bodies for connecting a second end of the first delay path pattern to a corresponding end of the second delay path pattern.

2. A distributed constant type delay line device as claimed in claim 1 in which said first and second base bodies have a generally rectangular shape with a size substantially identical to each other.

3. A distributed constant type delay line device as claimed in claim 2 in which said first and second delay path patterns are substantially identical to each other.

4. A distributed constant type delay line device as claimed in claim 1 in which said first and second ground conductors cover the second side of the first and second base bodies uniformly.

5. A distributed constant type delay line device as claimed in claim 1 in which said input/output pins are provided so as to hold both the first and second base bodies.

* * * * *

UNITED STATES PATENT AND TRADEMARK OFFICE
CERTIFICATE OF CORRECTION

PATENT NO. : 4,949,057

DATED : August 14, 1990

INVENTOR(S) : Taeko ISHIZAKA et al.

It is certified that error appears in the above-identified patent and that said Letters Patent is hereby corrected as shown below:

Col. 2, line 64, change "patter" to --pattern--.

Col. 3, line 66, delete " ,".

Col. 5, line 68, after "connected" insert --to--.

Col. 6, line 1, after "connected" insert --to--.

Signed and Sealed this

Nineteenth Day of May, 1992

Attest:

DOUGLAS B. COMER

Attesting Officer

Acting Commissioner of Patents and Trademarks